(12) United States Patent
Michaelson et al.

(10) Patent No.: US 9,829,805 B2
(45) Date of Patent: Nov. 28, 2017

(54) VAPOR DEPOSITION DEPOSITED PHOTORESIST, AND MANUFACTURING AND LITHOGRAPHY SYSTEMS THEREFOR

(71) Applicant: Applied Materials, Inc., Santa Clara, CA (US)

(72) Inventors: Timothy Michaelson, Milpitas, CA (US); Timothy W. Weidman, Sunnyvale, CA (US); Barry Lee Chin, Saratoga, CA (US); Majeed Foad, Sunnyvale, CA (US); Paul Deaton, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/357,085

(22) Filed: Nov. 21, 2016

(65) Prior Publication Data

US 2017/0068174 A1    Mar. 9, 2017

Related U.S. Application Data

(63) Continuation of application No. 14/139,457, filed on Dec. 23, 2013.
(Continued)

(51) Int. Cl.
*G03C 5/00* (2006.01)
*G03F 7/00* (2006.01)
(Continued)

(52) U.S. Cl.
CPC ............ *G03F 7/70716* (2013.01); *G03F 7/09* (2013.01); *G03F 7/167* (2013.01); *G03F 7/2037* (2013.01)

(58) Field of Classification Search
CPC .......... H01L 21/0273; H01L 21/31144; H01L 21/0276; H01L 21/3081; H01L 21/31058;
(Continued)

(56) References Cited

U.S. PATENT DOCUMENTS 4,842,675 A   6/1989   Chapman et al.
5,427,671 A   6/1995   Ahmed
(Continued)

FOREIGN PATENT DOCUMENTS

CN   1483157 A   3/2004
CN   1490848 A   4/2004
(Continued)

OTHER PUBLICATIONS

Final Office Action in U.S. Appl. No. 14/139,415 dated Oct. 7, 2016, 31 pages.
(Continued)

*Primary Examiner* — Mesfin Asfaw
(74) *Attorney, Agent, or Firm* — Servilla Whitney LLC

(57) ABSTRACT

A photoresist vapor deposition system includes: a vacuum chamber having a heating element and cooled chuck for holding a substrate, the vacuum chamber having a heated inlet; and a vapor deposition system connected to the heated inlet for volatilizing a precursor into the vacuum chamber for condensing a photoresist over the substrate cooled by the cooled chuck. The deposition system creates a semiconductor wafer system that includes: a semiconductor wafer; and a vapor deposited photoresist over the semiconductor wafer. An extreme ultraviolet lithography system requiring the semiconductor wafer system includes: an extreme ultraviolet light source; a mirror for directing light from the extreme ultraviolet light source; a reticle stage for imaging the light
(Continued)

from the extreme ultraviolet light source; and a wafer stage for placing a semiconductor wafer with a vapor deposited photoresist.

12 Claims, 2 Drawing Sheets

Related U.S. Application Data

(60) Provisional application No. 61/786,042, filed on Mar. 14, 2013.

(51) Int. Cl.
  *G03F 7/20* (2006.01)
  *G03F 7/16* (2006.01)
  *G03F 7/09* (2006.01)

(58) Field of Classification Search
  CPC ............. H01L 21/0228; H01L 21/0274; H01L 21/0262; H01L 2224/11622; G03F 7/094; G03F 7/16; G03F 7/0002; G03F 7/0035; G03F 7/405; G03F 7/26
  See application file for complete search history.

(56) References Cited

U.S. PATENT DOCUMENTS

| | | | |
|---|---|---|---|
| 5,645,646 A | 7/1997 | Beinglass et al. |
| 6,010,916 A | 1/2000 | Horton et al. |
| 6,142,641 A | 11/2000 | Cohen et al. |
| 6,202,318 B1 | 3/2001 | Guldi et al. |
| 6,224,638 B1 | 5/2001 | Jevtic et al. |
| 6,656,643 B2 | 12/2003 | Gupta et al. |
| 6,780,496 B2 | 8/2004 | Bajt et al. |
| 7,001,788 B2 | 2/2006 | Leon et al. |
| 7,005,227 B2 | 2/2006 | Yueh et al. |
| 7,186,630 B2 | 3/2007 | Todd |
| 7,279,252 B2 | 10/2007 | Aschke et al. |
| 7,282,318 B2 | 10/2007 | Jung |
| 7,541,297 B2 | 6/2009 | Mallick |
| 7,736,820 B2 | 6/2010 | Van Herpen |
| 7,867,923 B2 | 1/2011 | Mallick et al. |
| 7,892,719 B2 | 2/2011 | Hannah |
| RE42,388 E | 5/2011 | Summers |
| 7,960,077 B2 | 6/2011 | Ikuta et al. |
| 8,465,903 B2 | 6/2013 | Weidman et al. |
| 8,524,382 B2 | 9/2013 | Ogimoto |
| 8,536,068 B2 | 9/2013 | Weidman et al. |
| 8,562,794 B2 | 10/2013 | Kageyama |
| 2001/0019803 A1 | 9/2001 | Mirkanimi |
| 2002/0015855 A1 | 2/2002 | Sajoto et al. |
| 2002/0146648 A1 | 10/2002 | Ghandehari et al. |
| 2003/0176079 A1 | 9/2003 | Sogard |
| 2004/0009410 A1 | 1/2004 | Lercel et al. |
| 2004/0018733 A1 | 1/2004 | Hak |
| 2004/0029041 A1 | 2/2004 | Shih et al. |
| 2004/0091618 A1 | 5/2004 | Park et al. |
| 2004/0151988 A1 | 8/2004 | Silverman |
| 2004/0175630 A1 | 9/2004 | Wasson et al. |
| 2004/0234870 A1 | 11/2004 | Aschke et al. |
| 2005/0008864 A1 | 1/2005 | Ingen Schenau et al. |
| 2005/0009175 A1 | 1/2005 | Bergh et al. |
| 2005/0064298 A1 | 3/2005 | Silverman |
| 2005/0084773 A1 | 4/2005 | Krauth |
| 2005/0085042 A1 | 4/2005 | Chun et al. |
| 2005/0199830 A1 | 9/2005 | Bowering et al. |
| 2005/0266317 A1 | 12/2005 | Gallagher et al. |
| 2006/0024589 A1 | 2/2006 | Schwarzl et al. |
| 2006/0166108 A1 | 7/2006 | Chandrachood et al. |
| 2006/0245057 A1 | 11/2006 | Van Herpen et al. |
| 2006/0251973 A1 | 11/2006 | Takaki et al. |
| 2006/0275547 A1 | 12/2006 | Lee et al. |
| 2007/0020903 A1 | 1/2007 | Takehara et al. |
| 2007/0099414 A1 | 5/2007 | Frohberg et al. |
| 2007/0117359 A1 | 5/2007 | Todd |
| 2007/0141257 A1 | 6/2007 | Takahashi et al. |
| 2007/0187228 A1 | 8/2007 | Nozawa et al. |
| 2007/0240453 A1 | 10/2007 | Uno et al. |
| 2008/0076252 A1 | 3/2008 | Kon |
| 2008/0113303 A1 | 5/2008 | Silverman |
| 2008/0123073 A1 | 5/2008 | Shiraishi et al. |
| 2008/0254216 A1* | 10/2008 | Kadota ............... C07C 45/455 427/248.1 |
| 2009/0031953 A1 | 2/2009 | Ingle et al. |
| 2009/0091752 A1 | 4/2009 | Terasawa et al. |
| 2009/0176367 A1 | 7/2009 | Baks et al. |
| 2009/0278233 A1 | 11/2009 | Pinnington et al. |
| 2010/0099267 A1* | 4/2010 | Wang ................ H01L 21/0276 438/761 |
| 2010/0133092 A1 | 6/2010 | Mashimo et al. |
| 2011/0117726 A1 | 5/2011 | Pinnington et al. |
| 2011/0151677 A1 | 6/2011 | Wang et al. |
| 2011/0305978 A1 | 12/2011 | Iwashita et al. |
| 2012/0009765 A1 | 1/2012 | Olgado |
| 2012/0013976 A1 | 1/2012 | Weber |
| 2012/0099065 A1 | 4/2012 | Jang |
| 2012/0129083 A1 | 5/2012 | Yoshimori et al. |
| 2012/0141923 A1 | 6/2012 | Deweerd |
| 2012/0145534 A1 | 6/2012 | Kageyama |
| 2012/0147353 A1 | 6/2012 | Lafarre et al. |
| 2013/0094009 A1 | 4/2013 | Lafarre et al. |
| 2013/0115547 A1 | 5/2013 | Mikami et al. |
| 2013/0128248 A1* | 5/2013 | Komatsuda ......... G03F 7/70075 355/67 |
| 2013/0157177 A1 | 6/2013 | Yu et al. |
| 2013/0210222 A1 | 8/2013 | Lee et al. |
| 2014/0256129 A1 | 9/2014 | Lai et al. |
| 2014/0268080 A1 | 9/2014 | Beasley et al. |
| 2014/0268081 A1 | 9/2014 | Hofmann et al. |
| 2014/0268083 A1 | 9/2014 | Barman et al. |
| 2014/0272684 A1 | 9/2014 | Hofmann et al. |

FOREIGN PATENT DOCUMENTS

| | | |
|---|---|---|
| CN | 1538238 A | 10/2004 |
| CN | 1737687 A | 2/2006 |
| CN | 1756992 A | 4/2006 |
| CN | 102019266 A | 4/2011 |
| CN | 102782531 A | 11/2012 |
| JP | 2002222764 A | 8/2002 |
| JP | 2009531254 A | 9/2009 |
| TW | 200622508 A | 7/2006 |
| TW | 200804212 A | 1/2008 |
| TW | 201031998 A | 9/2010 |
| WO | 95/008840 A1 | 3/1995 |
| WO | 99/53535 A1 | 10/1999 |
| WO | 2012014904 A1 | 2/2012 |

OTHER PUBLICATIONS

Final Office Action in U.S. Appl. No. 14/139,457 dated Jul. 22, 2016, 16 pages.
Non-Final Office Action in U.S. Appl. No. 14/139,371 dated Aug. 5, 2016, 37 pages.
Non-Final Office Action in U.S. Appl. No. 15/357,085 dated Jan. 30, 2017, 10 pages.
PCT International Preliminary Report on Patentability in PCT/US2014/025110 dated Sep. 15, 2015, 10 pages.
PCT International Preliminary Report on Patentability in PCT/US2014/025116 dated Sep. 15, 2015, 9 pages.
PCT International Preliminary Report on Patentability in PCT/US2014/025124 dated Sep. 15, 2015, 8 pages.
PCT International Preliminary Report on Patentability in PCT/US2014/026826 dated Sep. 15, 2015, 7 pages.
PCT International Search Report and Written Opinion in PCT/US2014/025110 dated Jul. 22, 2014.
PCT International Search Report and Written Opinion in PCT/US2014/025116 dated Jul. 22, 2014.
PCT International Search Report and Written Opinion in PCT/US2014/025124 dated Jul. 24, 2014.

(56) References Cited

OTHER PUBLICATIONS

PCT International Search Report and Written Opinion in PCT/US2014/026826 dated Jul. 15, 2014.
PCT International Search Report and Written Opinion in PCT/US2014/026844 dated Sep. 3, 2014.

* cited by examiner

VAPOR DEPOSITION DEPOSITED PHOTORESIST, AND MANUFACTURING AND LITHOGRAPHY SYSTEMS THEREFOR

CROSS-REFERENCE TO RELATED APPLICATION(S)

This application is a continuation of U.S. Non-Provisional application Ser. No. 14/139,457, filed Dec. 23, 2013, which claims the benefit of U.S. Provisional Patent Application Ser. No. 61/786,042 filed Mar. 14, 2013, to each of which priority is claimed and each of which are incorporated herein by reference in their entireties.

The present application contains subject matter related to concurrently filed U.S. patent application Ser. No. 14/139, 307. The related application is assigned to Applied Materials, Inc. and the subject matter thereof is incorporated herein by reference thereto.

The present application contains subject matter related to concurrently filed U.S. patent application Ser. No. 14/139, 371. The related application is assigned to Applied Materials, Inc. and the subject matter thereof is incorporated herein by reference thereto.

The present application contains subject matter related to concurrently filed U.S. patent application Ser. No. 14/139, 415. The related application is assigned to Applied Materials, Inc. and the subject matter thereof is incorporated herein by reference thereto.

The present application contains subject matter related to concurrently filed U.S. patent application Ser. No. 14/139, 507. The related application is assigned to Applied Materials, Inc. and the subject matter thereof is incorporated herein by reference thereto.

TECHNICAL FIELD

The present invention relates generally to extreme ultraviolet lithography photoresists.

BACKGROUND

Extreme ultraviolet lithography (EUV, also known as soft x-ray projection lithography) is a contender to replace deep ultraviolet lithography for the manufacture of 0.13 micron, and smaller, minimum feature size semiconductor devices.

However, extreme ultraviolet light, which is generally in the 7 to 40 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a photoresist-coated semiconductor wafer.

Advances in photolithography techniques utilized to transfer patterns to photoresist have enabled increasingly smaller patterns to be transferred. This means that smaller integrated circuit features can be formed in integrated circuits. As a result, more elements can be put in a given area on a semiconductor integrated circuit resulting in the ability to greatly reduce the cost of integrated circuits while increasing functionality in the electronic devices in which the integrated circuits are used.

In the manufacture of semiconductor integrated circuits, a photoresist is deposited on a semiconductor wafer. On exposure to radiation and other processing, the exposed areas of the photoresist undergo changes that make those regions of the photoresist either harder or easier to remove. As a result, subsequent processing can selectively remove the easier to remove material, leaving behind the patterned, harder to remove material. This pattern can then be transferred to the semiconductor wafer via the photoresist, for example, by using the remaining photoresist as a mask for etching the desired features into the underlying layers of the semiconductor wafer.

There are many demands that are being placed on EUV photoresists because of the need to make finer and finer masks. Currently, there is no known material that simultaneously meets resolution, line edge roughness, and sensitivity (RLS) requirements for a EUV photoresist. In addition to RLS issues, conventional spin-on techniques for EUV photoresists are deficient in a number of areas.

First, spin-on photoresists are coated using a casting solvent, which can cause environmental problems.

Second, spin-on deposition techniques do not provide good thickness control and have variations in thickness in the vertical Z direction, especially as film thicknesses decrease.

Third, components of a spin-on photoresist solution may tend to segregate at the interfaces due to surface energy effects.

Thus, as EUV lithography becomes more necessary, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides photoresist deposition system which includes: a vacuum chamber having a heating element and cooled chuck for holding a substrate, the vacuum chamber having a heated inlet; and a vapor deposition system connected to the heated inlet for volatilizing a precursor into the vacuum chamber for condensing a photoresist over the substrate cooled by the cooled chuck.

An embodiment of the present invention provides an extreme ultraviolet lithography system that includes: an extreme ultraviolet light source; a mirror for directing light from the extreme ultraviolet light source; a reticle stage for placing an extreme ultraviolet mask blank; and a wafer stage for placing a wafer coated with a vapor deposited photoresist.

An embodiment of the present invention provides an extreme ultraviolet lithography system that includes: an extreme ultraviolet light source; a mirror for directing light from the extreme ultraviolet light source; a reticle stage for placing an extreme ultraviolet mask that has been patterned using a vapor deposited photoresist; and a wafer stage for placing a wafer.

An embodiment of the present invention provides a semiconductor wafer system that includes: a semiconductor wafer and a vapor deposition deposited photoresist over the semiconductor wafer.

Certain embodiments of the invention have other steps or elements in addition to or in place of those mentioned above. The steps or element will become apparent to those skilled in the art from a reading of the following detailed description when taken with reference to the accompanying drawings.

DETAILED DESCRIPTION

Figure 1:
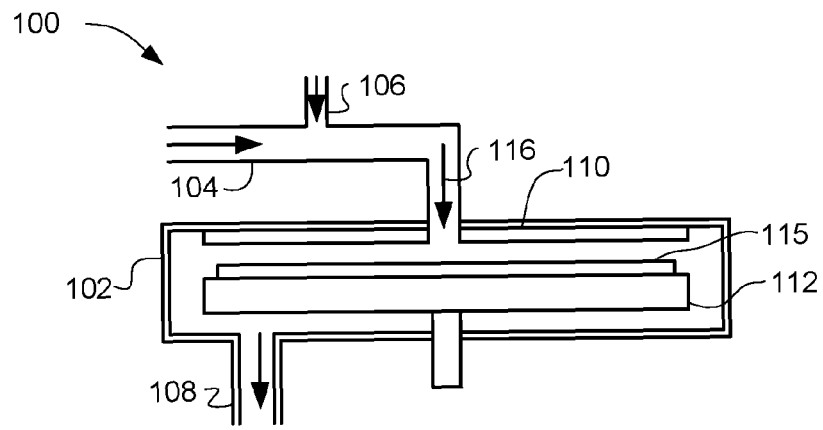
FIG. 1 is a cross-section of the vapor deposition system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

The same numbers are used in all the drawing FIGs. to relate to the same elements.

For expository purposes, the term "horizontal" as used herein is defined as a plane parallel to the plane or surface of the wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" indicates that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-section of a vapor deposition system in accordance with an embodiment of the present invention. A vapor deposition system could be a standalone system or part of a deposition system 100. A standalone system, designated as a vapor deposition system 100 includes a vacuum chamber 102 having a heated primary inlet 104 and one or more heated secondary inlets, such as an inlet 106. The vapor deposition system 100 has an outlet 108.

The vacuum chamber 102 contains a heating element 110 and a cooled chuck 112 for holding a semiconductor wafer 115, an extreme ultraviolet mask blank, or other mask blank.

Precursors 116 are volatilized and introduced to the vacuum chamber 102. When they reach the cooled chuck 112, the precursors 116 condense on the surface of the semiconductor wafer 115. Examples of the precursor 116 are metal alkoxides or other volatile metal oxide precursors such as hafnium t-butoxide, titanium n-butoxide, hafnium borohydride, and others.

The precursor could optionally be reacted with water or another oxidizing agent like ozone or peroxide to convert the metal oxide precursor into a metal oxide film, or metal oxide particles. While any metal oxide is possible, hafnium, zirconium, tin, titanium, iron, and molybdenum oxides work well. The reaction oxidant could be introduced at the same time or sequentially with the metal oxide precursor.

In some embodiments, precursors are introduced to the chamber to intentionally drive a gas phase reaction between them, resulting in the formation of larger molecules that are deposited on the semiconductor wafer 115. A second precursor is also introduced (either at the same time, or in sequence as in an atomic layer deposition (ALD) reaction with the other precursors).

This second precursor is a ligand that bonds with metal oxide particles or film, or initiates a ligand replacement reaction with existing ligands attached around a metal center. While any metal center is possible, hafnium, zirconium, tin, titanium, iron, and molybdenum metal centers work well. Examples include carboxylic acids like methacrylic acid, formic acid, acetic acid, and others, but may also include other functionalities such as sulfonic acids, dienes, or other chemistries which can form complexes with metal oxide particles or films.

Figure 2:
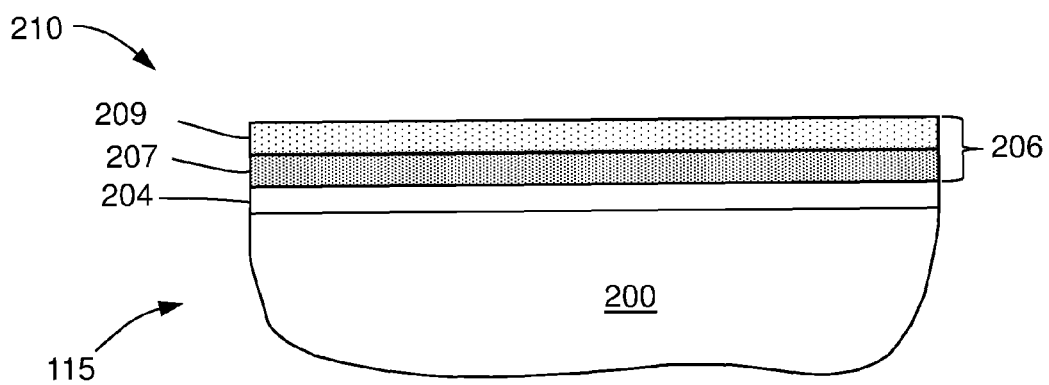
FIG. 2 is a portion of a semiconductor wafer in accordance with an embodiment of the present invention.

Referring now to FIG. 2, therein is shown a portion of the semiconductor wafer 115 in accordance with an embodiment of the present invention. The semiconductor wafer 115 has a substrate 200, which may include such materials as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc., and be patterned or non-patterned wafers. Substrates may have various dimensions, such as 200 mm or 300 mm diameter wafers, as well as, rectangular or square panes. Substrates may be exposed to a pretreatment process to polish, etch, reduce, oxidize, hydroxylate, anneal and/or bake the substrate surface.

The substrate 200 has a substrate surface 204, which may be of any substrate or material surface formed on a substrate upon which film processing is performed during a fabrication process. For example, the substrate surface 204 on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication.

A vapor deposited photoresist 206 having a top 209 and a bottom 207 is deposited on the substrate surface 204 by vapor deposition techniques using the vapor deposition system 100 of FIG. 1. The combination of the vapor deposited photoresist 206 and the substrate 200 form a semiconductor wafer system 210. The vapor deposited photoresist 206 has been found to be of particular use in extreme ultraviolet or smaller lithography. The vapor deposition system 100 involves a heated chamber and heated chemical delivery lines combined with the cooled chuck. The vapor deposited photoresist 206 may be deposited by vapor deposition (evaporation, decomposition, etc.), chemical vapor deposition (precursor reaction), atomic layer deposition, or other processes than spin-on deposition.

In addition, either simultaneously or in sequence, a photoactive compound may optionally be introduced into the chamber, also by vapor deposition techniques. This photoactive compound may be an acid generator, a radical generator, or a compound that can rearrange to generate an active chemical such as a ligand that can replace or catalyze the replacement, rearrangement, condensation, or change of ligands around the metal center such that a solubility change is induced in the film or particle.

Figure 3:
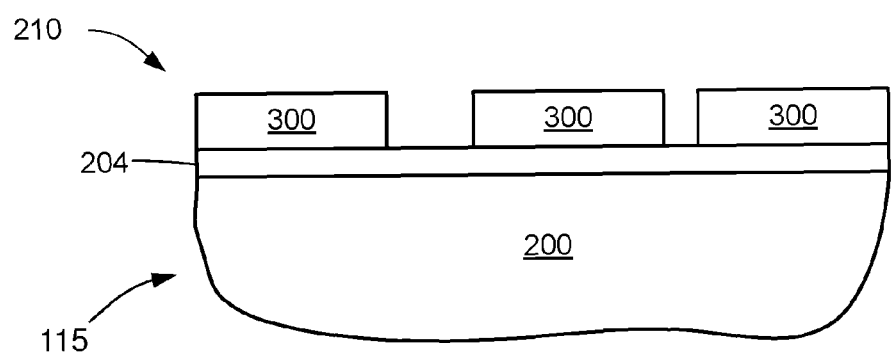
FIG. 3 is the vapor deposited photoresist of FIG. 2 after patterning in accordance with an embodiment of the present invention.

Referring now to FIG. 3, therein is shown the vapor deposited photoresist 206 of FIG. 2 after patterning in accordance with an embodiment of the present invention. On exposure to radiation (UV, DUV, EUV, e-beam, visible, infrared, ion-beam, x-ray, and others), a chemical reaction is induced in the vapor deposited photoresist 206, either at the metal oxide or in the photoactive compound. This reaction ultimately (either directly or after a post-exposure bake or other post exposure processing) results in a change in the solubility of the vapor deposited photoresist 206 in a solvent, or a change in the etch rate of the film in a plasma etch process. This change in solubility or etch rate can be used to ultimately pattern the vapor deposited photoresist 206 to provide a patterned vapor deposited photoresist 300.

In some embodiments, the process conditions are held constant throughout the deposition, giving rise to a photoresist 206 that is uniform in composition from top 209 to bottom 207. In other embodiments, the deposition conditions or chemicals used are varied as the photoresist is being deposited, giving rise to different photoresist compositions from top 209 to bottom 207.

In some embodiments, the properties of the photoresist at the bottom of the stack may be tailored to achieve specific goals. For example, the material at the bottom of the stack may be more absorbing of EUV photons, which in turn can lead to the generation of excess secondary electrons, some of which would in turn be directed upwards into the photoresist to catalyze additional reactions and improve the performance of the EUV photoresist. This improvement could be manifested in terms of sensitivity, line edge roughness, reduction in scumming or footing, or other improvements.

In other embodiments, the photoresist can be deposited on a substrate with desirable properties previously mentioned that instead was not deposited as part of the photoresist deposition, but instead was deposited by a separate, independent process.

In yet other embodiments, the photoresist is deposited on a more conventional substrate such as semiconductors, metals, or dielectrics including silicon, silicon oxide, germanium, silicon nitride, metals, metal oxides, metal nitrides, bottom anti-reflective coatings, and other substrates.

In some embodiments, the precursors are introduced into the vapor phase by thermal evaporation, but other techniques such as vacuum spraying may also be used for deposition.

In some embodiments, the ratio of the number of ligands to the number of metal atoms or particle size is controlled to control photoresist properties such as photosensitivity In some embodiments, an additional precursor may be co-deposited in the photoresist to limit the reaction or diffusion of the photoactive compound. In the case of a photoacid generator, this additional precursor might be a base or photodecomposable base. In the case of a photoradical generator, this precursor might be a radical scavenger, and so on.

In some embodiments, this process is performed on a system that uses a rotating chuck to improve the deposition thickness uniformity across the wafer. In other embodiments, a cold trap is used to capture unreacted precursor materials before they leave the chamber.

Embodiments of the present invention have the potential to satisfy the requirements in these key areas better than existing technology. Furthermore, deposition of a photoresist by vacuum techniques has advantages over conventional spin-on techniques in several areas. First, it eliminates solvent from the system, which is an environmental benefit. Next, vacuum deposition techniques allow the user to tune the deposition from conformal to planarizing, whereas spin-on films tend to only be planarizing. Also, vacuum deposition techniques give the user more control over the film composition through thickness, and allow the user to create a uniform film in the Z direction, whereas during a spin on process, components of the photoresist solution may tend to segregate at the interfaces due to surface energy effects. Vacuum deposition techniques also would allow for the creation of a controlled composition change through thickness as the film is being deposited by varying the deposition conditions. This control is not possible with conventional techniques.

Primary applications anticipated for embodiments of the present the invention are within the overall field of patterning for microelectronic and photonic devices using any type of patterned radiation technique (visible, deep UV, EUV, electron-beam or X-ray lithography). Because of the unique aspects of the deposition method described, applications would not be restricted only to flat, planar substrates.

Figure 4:
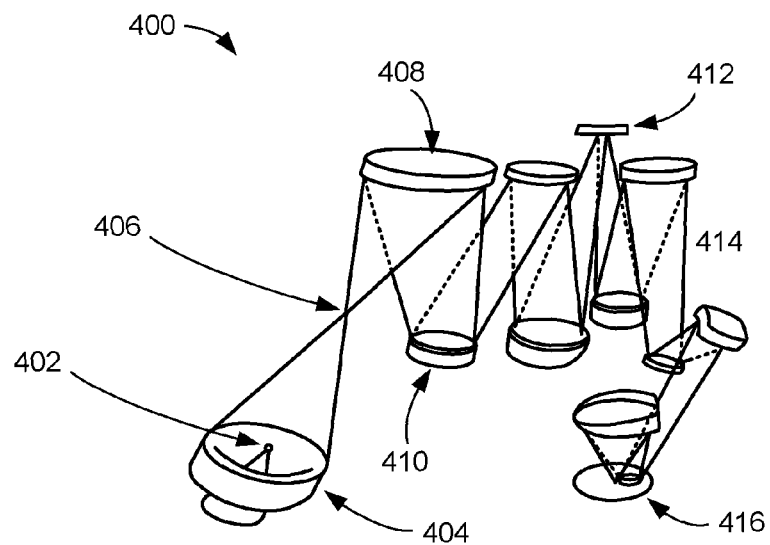
FIG. 4 is an optical train for a EUV lithography system in accordance with an embodiment of the present invention.

Referring now to FIG. 4, therein is shown an optical train 400 for a EUV lithography system in accordance with an embodiment of the present invention. The optical train 400 has an extreme ultraviolet light source 402, such as a plasma source, for creating the EUV light and collecting it in a collector 404. The collector 404 provides the light to a field facet mirror 408 which is part of an illuminator system 406 which further includes a pupil facet mirror 410. The illuminator system 406 provides the EUV light to a reticle 412, which reflects the EUV light through projection optics 414 and onto a patterned semiconductor wafer 416.

Figure 5:
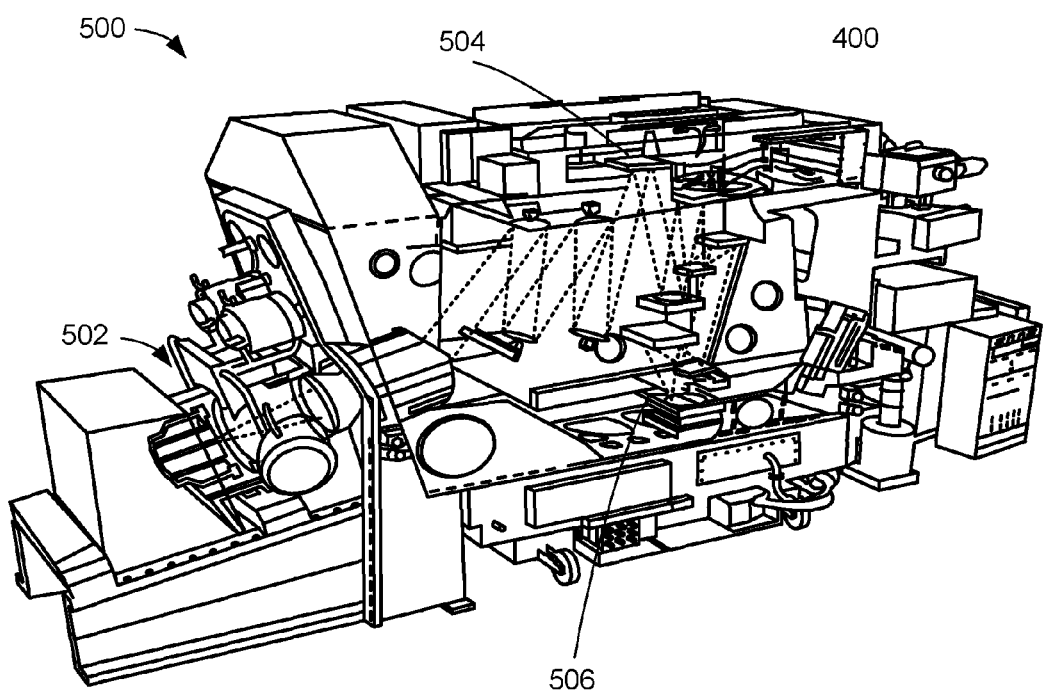
FIG. 5 is shown a EUV lithography system in accordance with an embodiment of the present invention.

Referring now to FIG. 5, therein is shown a EUV lithography system 500 in accordance with an embodiment of the present invention. The EUV lithography system 500 includes a EUV light source area 502, a reticle stage 504 and a wafer stage 506 as adjuncts to the optical train 400.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. The vapor deposited photoresist 206 of FIG. 2 is a critical component of the EUV lithography system 500 and the EUV lithography system 500 cannot perform its function without a vapor deposited photoresist.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. An extreme ultraviolet lithography system comprising:
   an extreme ultraviolet light source;
   a mirror for directing light from the extreme ultraviolet light source;
   a reticle stage for imaging the light from the extreme ultraviolet light source on to an extreme ultraviolet mask; and
   a wafer stage for placing a semiconductor wafer coated with a vapor deposited
   photoresist for receiving the light from the reticle stage, the vapor deposited photoresist having a top and a bottom and a different photoresist composition between the top and the bottom of the vapor deposited photoresist, the bottom being more absorbing of EUV photons from EUV radiation in a wavelength range of from 7 nanometers to 40 nanometers than the top.

2. The system as claimed in claim 1 wherein the vapor deposited photoresist is a volatile metal oxide.

3. The system as claimed in claim 1 wherein the vapor deposited photoresist includes a number of ligands and a number of metal atoms, and there is a controlled ratio of the number of ligands to the number of metal atoms to control a photoresist property.

4. The system as claimed in claim 1 wherein the vapor deposited photoresist contains a ligand.

5. The system as claimed in claim 1 wherein the vapor deposited photoresist is a ligand around a metal center.

6. The system as claimed in claim 1 wherein the vapor deposited photoresist is a ligand bonded with a metal oxide.

7. A semiconductor wafer system comprising:
   a semiconductor wafer; and
   a vapor deposited photoresist over the semiconductor wafer, the vapor deposited photoresist having a top and a bottom and a different photoresist composition between the top and the bottom of the vapor deposited photoresist, the bottom being more absorbing of EUV photons from EUV radiation in a wavelength range of from 7 nanometers to 40 nanometers than the top.

8. The semiconductor wafer system as claimed in claim 7 wherein the vapor deposited photoresist is a volatile metal oxide.

9. The semiconductor wafer system as claimed in claim 7 wherein the vapor deposited photoresist includes a number of ligands and a number of metal atoms, and there is a controlled ratio of the number of ligands to the number of metal atoms to control a photoresist property.

10. The semiconductor wafer system as claimed in claim 7 wherein the vapor deposited photoresist includes a ligand.

11. The semiconductor wafer system as claimed in claim 7 wherein the vapor deposited photoresist is a ligand around a metal center.

12. The semiconductor wafer system as claimed in claim 7 wherein the vapor deposited photoresist is a ligand bonded with a metal oxide.

* * * * *